(12) United States Patent
Nikonov et al.

(10) Patent No.: US 12,052,873 B2
(45) Date of Patent: Jul. 30, 2024

(54) NEURAL COMPUTING DIES WITH STACKED NEURAL CORE REGIONS

(71) Applicant: Intel Corporation, Santa Clara, CA (US)

(72) Inventors: Dmitri E. Nikonov, Beaverton, OR (US); Clifford Lu Ong, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 843 days.

(21) Appl. No.: 16/989,430

(22) Filed: Aug. 10, 2020

(65) Prior Publication Data
US 2020/0373329 A1 Nov. 26, 2020

(51) Int. Cl.
| | |
|---|---|
| *H10B 51/20* | (2023.01) |
| *G06N 3/063* | (2023.01) |
| *G11C 11/54* | (2006.01) |
| *H01L 25/065* | (2023.01) |
| *H01L 29/06* | (2006.01) |
| *H01L 29/423* | (2006.01) |
| *H01L 29/78* | (2006.01) |
| *H01L 29/786* | (2006.01) |
| *H10B 51/30* | (2023.01) |
| *H10B 51/40* | (2023.01) |

(52) U.S. Cl.
CPC ............ *H10B 51/20* (2023.02); *G06N 3/063* (2013.01); *G11C 11/54* (2013.01); *H01L 25/0657* (2013.01); *H01L 29/0673* (2013.01); *H01L 29/42392* (2013.01); *H01L 29/78391* (2014.09); *H01L 29/7851* (2013.01); *H01L 29/78696* (2013.01); *H10B 51/30* (2023.02); *H10B 51/40* (2023.02); *H01L 2225/06506* (2013.01)

(58) Field of Classification Search
CPC . G06N 3/063; H01L 25/0657; H01L 29/0673; H01L 29/42392; H01L 29/78696; H01L 29/78391; H01L 29/7851; H01L 2225/06506; H10B 51/20; H10B 51/30; H10B 51/40; G11C 11/54
See application file for complete search history.

(56) References Cited

U.S. PATENT DOCUMENTS

2017/0364790 A1* 12/2017 Leobandung .......... G06N 3/063
2019/0042377 A1* 2/2019 Teig .................... H01L 23/3128
(Continued)

OTHER PUBLICATIONS

Csaba, Gyorgy, et al., "Perspectives of Using Oscillators for Computing and Signal Processing," arXiv: 1805.09056v1 [cs.ET] May 23, 2018; 12 pages.
(Continued)

*Primary Examiner* — Changhyun Yi
(74) *Attorney, Agent, or Firm* — Akona IP PC

(57) ABSTRACT

Disclosed herein are neural computing dies with stacked neural core regions as well as related methods and assemblies. In some embodiments, a neural computing die may include: a first neural core region; a second neural core region; and an inter-core interconnect region in a volume between the first neural core region and the second neural core region, wherein the inter-core interconnect region includes a conductive pathway between the first neural core region and the second neural core region, and the conductive pathway includes a conductive via.

20 Claims, 4 Drawing Sheets

(56) References Cited

U.S. PATENT DOCUMENTS

2019/0354843 A1* 11/2019 Park .................. G11C 13/0023
2020/0135720 A1*  4/2020 Brewer ................ H01L 25/105
2021/0133128 A1*  5/2021 Jo ........................ G06F 3/0656

OTHER PUBLICATIONS

Merolla, Paul A., et al., "A Million Spiking-Neuron Integrated Circuit with a Scalable Communication Network and Interface," Science, vol. 345, Issue 668, Aug. 8, 2014; 7 pages.

Nikonov, Dmitri E., et al., "Benchmarking Delay and Energy of Neural Inference Circuits," IEEE Journal on Exploratory Solid-State Computational Devices and Circuits, vol. 5, No. 2, Dec. 2019; plus Supplementary Materials; 46 pgs.

Nikonov, Dmitri E., et al., "Coupled-Oscillator Associative Memory Array Operation for Pattern Recognition," IEEE Journal on Exploratory Solid-State Computational Devices and Circuits, vol. 1, Nov. 2015; 85 pages.

* cited by examiner

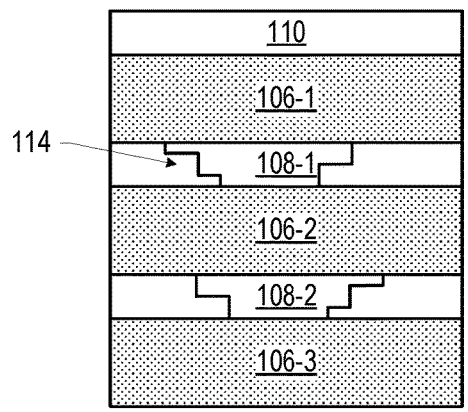
FIG. 1
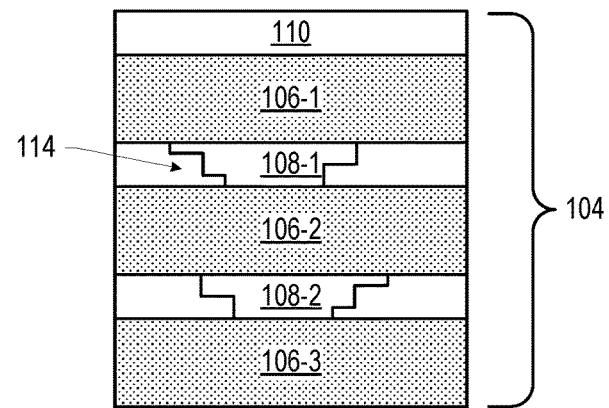
FIG. 2A
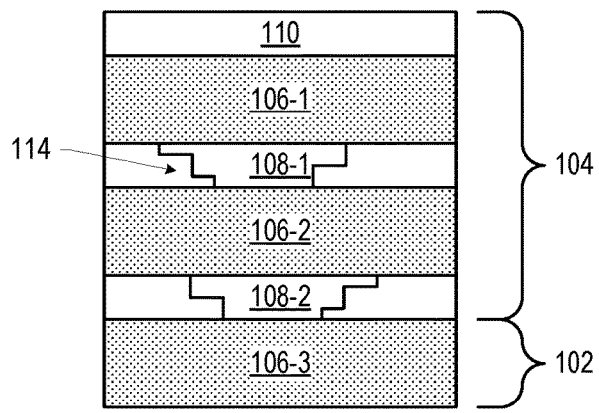
FIG. 2B
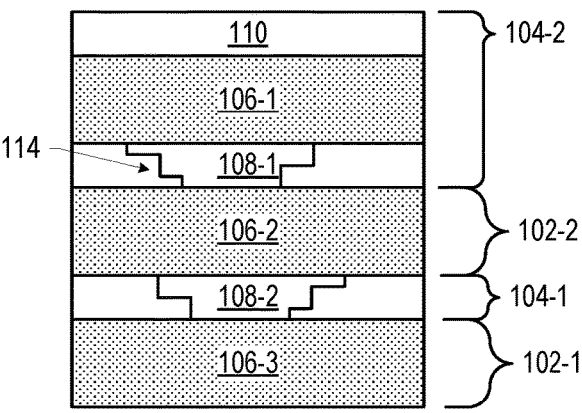
FIG. 2C
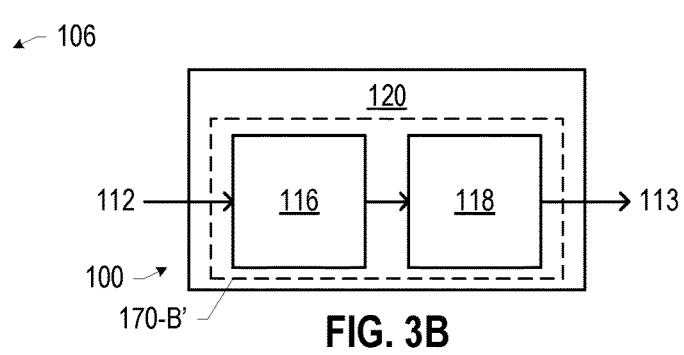
FIG. 3B
FIG. 3A

NEURAL COMPUTING DIES WITH STACKED NEURAL CORE REGIONS

BACKGROUND

Neural networks are a computational approach based on a collection of neural computing units that loosely model the way the brain solves problems. Such systems may be self-learning and trained rather than explicitly programmed.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1 and 2A-2C are side, cross-sectional views of example neural computing dies, in accordance with various embodiments.

FIGS. 3A-3D are various views of portions of example neural computing dies, in accordance with various embodiments.

DETAILED DESCRIPTION

Figure 3C:
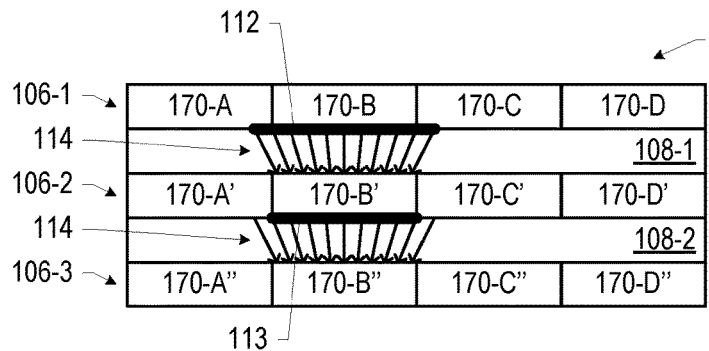

Disclosed herein are neural computing dies with stacked neural core regions as well as related methods and assemblies. In some embodiments, a neural computing die may include: a first neural core region; a second neural core region; and an inter-core interconnect region in a volume between the first neural core region and the second neural core region, wherein the inter-core interconnect region includes a conductive pathway between the first neural core region and the second neural core region, and the conductive pathway includes a conductive via.

A neural network may include multiple neural cores, each including multiple neurons therein, and interconnections between the neural cores. A neural core may itself include one or more inputs, one or more output neurons, and one or more synapses coupled between the inputs and the output neurons. A synapse may include circuitry to weight a vector of inputs, and an output neuron may include circuitry to sum the outputs of multiple synapses (and one or more additional terms, such as a bias term, as desired), and apply an activation function to the sum. Outputs of neurons in some neural cores may serve as inputs to neurons in other neural cores.

Conventional neural network circuits typically include neural cores distributed in a single plane, with interconnections between different neural cores located within the plane. In some conventional approaches, these interconnections are mediated by routers that typically utilize time-division multiplexing to route signals between neural cores along shared buses. Such conventional circuits may require a complex addressing system to properly control the flow of data and may exhibit significant latency as the routers wait for a first signal to be transmitted before transmitting a second signal. Use of routing-type approaches also typically limits the type of signals that may be transmitted to spiking-type signals (e.g., signals in which data is encoded in the number and/or frequency of spikes in a voltage waveform), and do not conventionally accommodate value-based signals (e.g., signals in which data is encoded in the amplitude of a voltage waveform). In other conventional approaches, a neural network circuit may include dedicated wire connections between coplanar neural cores, but such dedicated wire connections typically require a large amount of area simply for routing and result in interconnects that are very long (and therefore, for example, lossy).

The neural computing dies disclosed herein may achieve lower latency, shorter interconnects, and a smaller footprint than conventional neural network circuits. As discussed in further detail below, in some of the embodiments disclosed herein, a neural computing die may include neural cores oriented in a vertical stack so that the output of one neural core is directed to the input of a vertically adjacent neural core. In embodiments in which the inputs and outputs of neural cores correspond to pixels of an image, and cascaded stages of neural cores are used to process the image (e.g., in convolutional neural network applications), the inputs to a neural core in one stage may be drawn from the corresponding outputs of a neural core in the previous stage as well as the neighboring outputs of neural cores in the previous stage. This may substantially simplify routing and may be particularly advantageous.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 2" may be used to refer to the collection of drawings of FIGS. 2A-2C, and the phrase "FIG. 3" may be used to refer to the collection of drawings of FIGS. 3A-3D.

FIG. 1 is a side, cross-sectional view of an example neural computing die 100, in accordance with various embodiments. In some embodiments, a neural computing die 100 may be referred to as a neural accelerator chip, or a neural accelerator. As illustrated in FIG. 1, a neural computing die 100 may include multiple neural core regions 106 having inter-core interconnect regions 108 therebetween, arranged in a vertical stack (i.e., such that at least one conductive via is included in a conductive pathway 114, coupling the adjacent neural core regions 106, of an inter-core interconnect region 108, as discussed further below with reference to FIGS. 4-6). An inter-core interconnect region 108 may include such conductive pathways 114 between the neural core regions 106 on either side of the inter-core interconnect region 108 (e.g., the inter-core interconnect region 108-1 of FIG. 1 may include conductive pathways 114 between the neural core region 106-1 and the neural core region 106-2). In some embodiments, an inter-core interconnect region 108 may include conductive pathways 114 between output neurons of the "preceding" neural core region 106 and inputs of the "subsequent" neural core region 106 (e.g., the inter-core interconnect region 108-1 in FIG. 1 may include conductive pathways 114 between the output neurons of the neural core region 106-1 and the inputs of the neural core region 106-2). Thus, a neural core region 106-J providing inputs to a neural core region 106-K may be located "above" the neural core region 106-K (e.g., closer to the input region 110), and a neural core region 106-L accepting outputs from the neural core region 106-K may be located "below" the neural core region 106-K (e.g., farther from the input region 110). The embodiments of FIG. 1 depict three neural core regions 106 (labeled 106-1, 106-2, and 106-3) in a neural computing die 100, but this is simply for ease of illustration, and a neural computing die 100 may have fewer neural core regions 106 (e.g., two neural core regions 106) or more than three neural core regions 106 (e.g., seven neural core regions 106, corresponding to the seven stages of the LeNet-5 convolutional neural network model), as desired.

A neural computing die 100 may also include an input region 110; in some embodiments, the input region 110 may include the outermost layer or layers of the neural computing dies 100. For example, the input region 110 may include conductive contacts, such as conductive pads or pedestals, at a surface of the neural computing die 100, and may be configured for contact with an external device that provides an input to the neural core regions 106 of the neural computing die 100 (e.g., an image capture device that will provide an input image to the neural computing die 100). The input region 110 in such embodiments may include memory cells to store the image (e.g., one or more memory cells per pixel of an input image). In another example, the input region 110 may itself include an integrated device that provides an input to the neural core regions 106 of the neural computing die 100 (e.g., an image capture device, such as a charge-coupled device (CCD), as discussed below with reference to FIG. 3A).

The neural core regions 106 included in a neural computing die 100 may be distributed between the front-end region(s) and/or the back-end region(s) of a neural computing die 100 in any desired manner. FIGS. 2A-2C are side, cross-sectional views of example arrangements of neural core region 106 in a neural computing die 100, in accordance with various embodiments. For example, FIG. 2A illustrates an embodiment in which the input region 110 and all of the neural core regions 106 are located in the back-end region 104 of a neural computing die 100, above a front-end region 102. As used herein, a "front-end region" may refer to a region formed as part of front-end fabrication operations and may be a region in which devices (e.g., transistors) are built up on an underlying substrate material such as a semiconductor material or glass. A front-end region 102 may retain at least a portion of the underlying substrate material. Examples of layers that may be included in a front-end region 102 are discussed below with reference to FIG. 6. A "back-end region" may refer to a region formed as part of back-end fabrication operations and may be a region including one or more layers of a metallization stack (e.g., layers of interconnects through an interlayer dielectric material). In some embodiments, a back-end region 104 may also include transistors (e.g., thin film transistors, as discussed below with reference to FIG. 5), or may not include transistors. Examples of layers that may be included in a back-end region 104 are discussed below with reference to FIGS. 4-5. In some examples of the embodiment of FIG. 2A, the front-end region 102 may include logic circuitry different from neural network circuitry. For example, the front-end region 102 may include output buffering circuitry, some portions of analog-to-digital conversion circuitry, or other circuitry. In some examples of the embodiment of FIG. 2A, the front-end region 102 may include transistors that are part of neural network circuitry (and are coupled to one or more of the neural core regions 106), as discussed further below with reference to FIG. 2.

FIG. 2B illustrates an embodiment in which the input region 110 and some of the neural core regions 106 are located in the back-end region 104 of a neural computing die 100, and one neural core region 106 (or more neural core regions 106) is located in the front-end region 102. For example, in some embodiments, the neural core region 106-3 includes front-end transistors (e.g., as discussed below with reference to FIG. 6), the inter-core interconnect region 108-2 includes the lowest layers in a metallization stack (e.g., M0, M1, etc., as discussed below.), and the neural core regions 106-2 and 106-1 include back-end transistors (e.g., as discussed below with reference to FIG. 5).

FIG. 2C illustrates an embodiment with multiple alternating front-end regions 102 and back-end regions 104. Such an embodiment may be constructed using a wafer-to-wafer bonding technique, for example; a first wafer including the front-end region 102-1 and the back-end region 104-1 may be bonded to another wafer including the front-end region 102-2 and the back-end region 104-2 to form the neural computing die 100 of FIG. 2C. FIG. 1 illustrates portions of example embodiments of neural computing die 100, and any neural computing die 100 may include other regions and features.

In some embodiments, a neural core region 106 may include multiple cells 170. For example, FIG. 3A is a top view of a rectangular array of cells 170 that may be included in a neural core region 106-1; the number and arrangement of cells 170 included in FIG. 3A is simply illustrative, and any desired number and arrangement may be used. In some embodiments, the cells 170 included in a neural core region 106 may all correspond to a same stage in a neural network model (e.g., a stage in a convolutional neural network model for image processing).

Each cell 170 may include some or all of a set of cell circuitry 120. FIG. 3B is a block diagram of cell circuitry 120 that may be wholly or partially included in a cell 170-B' of a neural core region 106-2 in the portion of a neural computing die 100 illustrated in FIG. 3B. Cell circuitry 120 may include synapse circuitry 116 and neuron circuitry 118. The synapse circuitry 116 may include one or more memory cells to store data indicative of weights to be applied to the inputs; in some embodiments, the synapse circuitry 116 may include a static random access memory (SRAM) cell that itself includes a number of transistors (e.g., between six and eight transistors). The neuron circuitry 118 may include circuitry to generate the sum of the weighted inputs and apply an activation function to the sum; in some embodiments, the neuron circuitry 118 may be a complementary metal oxide semiconductor (CMOS) circuit that includes a number of transistors (e.g., 10 or more). The input 112 to the cell circuitry 120 may be the output of one or more sets of cell circuitry 120 associated with cells 170 in a "preceding" neural core region 106 (through an appropriate inter-core interconnect region 108); for example, as illustrated in FIG. 3C, the input 112 to the cell circuitry 120 associated with the cell 170-B' in the neural core region 106-2 may include at least some of the outputs of the cells 170-A, 170-B, and 170-C in the neural core region 106-1, transmitted to the neural core region 106-2 via conductive pathways 114 in the inter-core interconnect region 108-one. The output 113 of the cell circuitry 120 may be the input to one or more sets of cell circuitry 120 associated with cells 170 in a "subsequent" neural core region 106 (through an appropriate inter-core interconnect region 108); for example, as illustrated in FIG. 3C, the output 113 of the cell circuitry 120 associated with the cell 170-B' in the neural core region 106-2 may provide at least some of the inputs to the cells 170-A", 170-B", and 170-C" in the neural core region 106-3, transmitted to the neural core region 106-3 via conductive pathways 114 in the inter-core interconnect region 108-2. Although the cells 170 in different ones of the neural core regions 106 of FIG. 3 are shown as having the same "size" (e.g., corresponding to the same number of pixels in an image, as discussed further below), this is simply for ease of illustration, and cells 170 may have any desired size.

FIG. 3B shows a dashed line corresponding to the cell 170-B' around the synapse circuitry 116 and the neuron circuitry 118 of the cell circuitry 120; this is indicate that, in some embodiments, at least some of the cell circuitry 120 may be located outside the cell 170-B' of the neural core region 106-2. In some embodiments, some or all of the synapse circuitry 116 of the cell circuitry 120 corresponding to a cell 170 of a neural core region 106 may be located outside the cell 170; for example, when the neural core region 106 is located in a back-end region 104 of a neural computing die 100, one or more of the transistors of the synapse circuitry 116 of the cell circuitry 120 corresponding to a cell 170 of the neural core region 106 may be located in a front-end region 102 of the neural computing die 100 (and may be connected to the cell 170 by conductive lines and vias through the back-end region 104, for example). In some embodiments, some or all of the transistors of the synapse circuitry 116 of the cell circuitry 120 corresponding to a cell 170 of a neural core region 106 may be located within the cell 170 (and thus within the neural core region 106). In some embodiments, some or all of the neuron circuitry 118 of the cell circuitry 120 corresponding to a cell 170 of a neural core region 106 may be located outside the cell 170; for example, when the neural core region 106 is located in a back-end region 104 of a neural computing die 100, one or more of the transistors of the neuron circuitry 118 of the cell circuitry 120 corresponding to a cell 170 of the neural core region 106 may be located in a front-end region 102 of the neural computing die 100 (and may be connected to the cell 170 by conductive lines and vias through the back-end region 104, for example). In some embodiments, some or all of the transistors of the neuron circuitry 118 of the cell circuitry 120 corresponding to a cell 170 of a neural core region 106 may be located within the cell 170 (and thus within the neural core region 106).

Figure 3D:
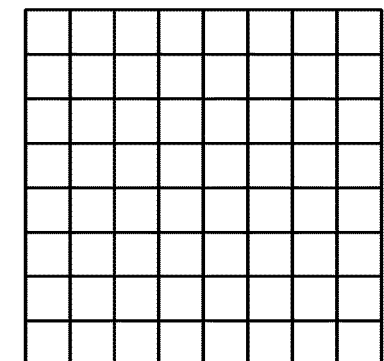

In some embodiments, the input region 110 may provide an array of inputs to the first (closest) neural core region 106-1. In some embodiments, this array of inputs may correspond to an array of pixels. For example, FIG. 3D is a top view of an array of pixels 166 of the input region 110 when the input region 110 is to provide an image input to the neural core regions 106. In some embodiments, the pixels 166 may be pixels of a CCD included in the input region 110, while in other embodiments, the pixels 166 may correspond to conductive contacts to an external image capture device. As noted above, in some neural processing applications, a cell 170 may be part of a stage (corresponding to a neural core region 106) in a neural network model, and in some such applications, the inputs to that cell 170 may be the outputs of only the "neighboring" cells 170 in a preceding stage (corresponding to a neural core region 106). This is illustrated in FIG. 3C, in which the input 112 to the cell 170-B' in the neural core region 106-2 includes some or all of the outputs of its neighboring cells 170-A, 170-B, and 170-C in the "preceding" neural core region 106-1. The conductive pathways 114 through the inter-core interconnect region 108-1 in such an application may be easier to route than in applications in which the connections between cells 170 in different neural core regions 106 are more widely distributed.

Figure 4:
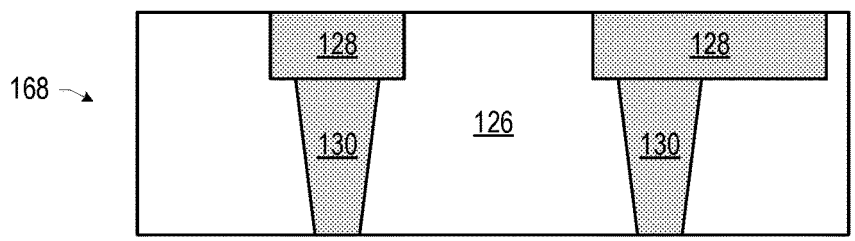
FIG. 4 is a side, cross-sectional view of an example inter-core interconnect layer that may be included in an inter-core interconnect region of a neural computing die, in accordance with various embodiments.

A neural core region 106 and an inter-core interconnect region 108 included in a neural computing die 100 may each include one or more layers in the neural computing die 100. For example, FIG. 4 is a side, cross-sectional view of an example interconnect layer 168 that may be included in a neural core region 106 or an inter-core interconnect region 108 of a neural computing die 100. The interconnect layer 168 may include one or more conductive lines 128 in conductive contact with one or more conductive vias 130. The particular number and arrangement of conductive lines 128 and conductive vias 130 in FIG. 4 is simply illustrative, and any suitable number and arrangement may be used. When included in an inter-core interconnect region 108, the conductive lines 128 and conductive vias 130 may be part of conductive pathways 114. One or more interconnect layers 168 may form a metallization stack (also called an interlayer dielectric (ILD) stack) of the neural computing die 100.

The conductive lines 128 and conductive vias 130 may be arranged within an interconnect layer 168 to route electrical signals according to a wide variety of designs (in particular, the arrangement is not limited to the particular configuration of interconnect structures depicted in FIG. 4). An inter-core interconnect region 108 or a neural core region 106 may include any desired number of interconnect layers 168.

Figure 6:
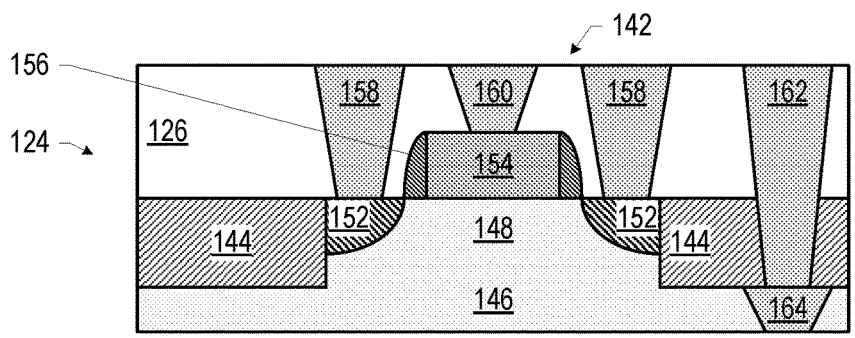
FIG. 6 is a side, cross-sectional view of an example front-end layer that may be included in a neural core region of a neural computing die, in accordance with various embodiments.

The conductive lines 128 may be arranged to route electrical signals in a direction of a plane that is perpendicular to the vertical axis defining the stack of neural core regions 106 (e.g., substantially parallel with a surface of the substrate 146 upon which the front-end layer 124 is formed, as illustrated in FIG. 6). For example, the conductive lines 128 may route electrical signals in a direction in and out of the page from the perspective of FIG. 4. The conductive vias 130 may be arranged to route electrical signals in a direction of a plane that is parallel to the vertical axis defining the stack of neural core regions 106 (e.g., substantially perpendicular to the surface of the substrate 146 upon which the front-end layer 124 is formed, as illustrated in FIG. 6). In some embodiments, the conductive vias 130 may electrically couple conductive lines 128 of different interconnect layers 168 together.

The interconnect layers 168 may include an insulating material 126 disposed between the interconnect structures, as shown in FIG. 4. In some embodiments, the insulating material 126 disposed between the interconnect structures in different ones of the interconnect layers 168 may have different compositions; in other embodiments, the composition of the insulating material 126 in different interconnect layers 168 may be the same. The insulating material 126 may be a dielectric material, such as silicon dioxide. In some embodiments, the insulating material 126 may be any suitable interlayer dielectric (ILD) material.

When an interconnect layer 168 is formed directly on a front-end layer 124 (FIG. 6), that interconnect layer 168 may be referred to as Metal 1 or M1. Further interconnect layers 168 formed on that interconnect layer 168 may be referred to as Metal 2 (M2), Metal 3 (M3), etc. Although the conductive lines 128 and the conductive vias 130 are structurally delineated with a line within the interconnect layer 168 and others of the accompanying drawings for the sake of clarity, the conductive lines 128 and the conductive vias 130 may be structurally and/or materially contiguous (e.g., simultaneously filled during a dual-damascene process) in some embodiments.

Figure 5:
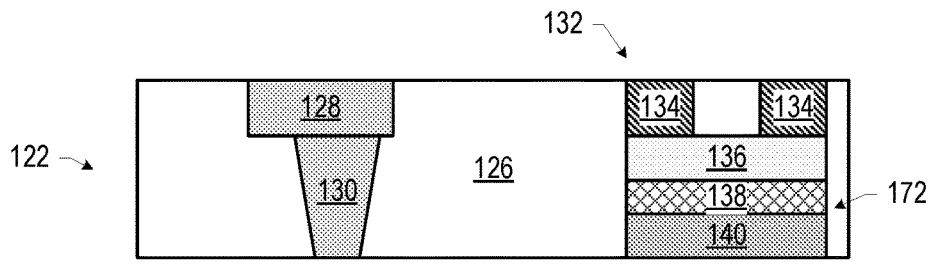
FIG. 5 is a side, cross-sectional view of an example back-end layer that may be included in a neural core region of a neural computing die, in accordance with various embodiments.

FIG. 5 is a side, cross-sectional view of an example back-end layer 122 that may be included in a neural core region 106 of a neural computing die 100. A back-end layer 122 may include any of the interconnect structures discussed above with reference to FIG. 4 (e.g., including conductive lines 128 and conductive vias 130). A back-end layer 122 may also include one or more back-end transistors 132. As shown, one or more back-end transistors 132 may share "layers" in a metallization stack with conductive vias and/or lines (e.g., one or more back-end transistors 132 may be arranged laterally with conductive vias 130 and/or conductive lines 128 in a metallization stack). In some embodiments, a back-end layer 122 may include a storage element (not shown) to which the back-end transistor 132 is coupled; the storage element and the back-end transistor 132 may together act as a memory cell. In some embodiments, the back-end transistor 132 may itself be a memory device (e.g., a 1 T memory device, as discussed below with reference to embodiments in which the material 138 includes a ferroelectric material stack).

The back-end transistor 132 may include a channel 136 and a gate 172, in accordance with various embodiments. The gate 172 may include a gate electrode 140 and a material 138, with the material 138 disposed between the gate electrode 140 and the channel 136.

The channel 136 may be composed of semiconductor material systems including, for example, n-type or p-type materials systems. In some embodiments, the channel 136 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, strontium oxide, or tungsten oxide. In some embodiments, the channel 136 may include indium gallium zinc oxide (IGZO). In some embodiments, the channel 136 may be a single-crystal semiconductor material, such as single-crystal silicon or single-crystal germanium. In some embodiments, the channel 136 may have a bandgap that is greater than 1.3 electron-volts; such embodiments may allow the back-end transistor 132 to exhibit lower leakage in the "off" state, yielding a larger signal-to-noise ratio and thus improved performance. In some embodiments, the channel 136 may include a metal. In some embodiments, the channel 136 may have a thickness between 5 nanometers and 30 nanometers.

The gate electrode 140 may include at least one p-type work function metal or n-type work function metal, depending on whether the back-end transistor 132 is to be a p-type metal oxide semiconductor (PMOS) or an n-type metal oxide semiconductor (NMOS) transistor. In some implementations, the gate electrode 140 may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode 140 include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode 140 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning). In some embodiments, the gate electrode 140 may include a nitride material, such as titanium nitride, tantalum nitride, tungsten nitride, or tantalum carbonitride.

In some embodiments, the material 138 may include a ferroelectric material stack. A back-end transistor 132 including a ferroelectric material stack in the material 138 may exhibit polarization in the ferroelectric material during operation, shifting the current-voltage (I-V) characteristic (e.g., the threshold voltage) of the back-end transistor 132 depending upon the state of the polarization and thus allowing the transistor to be used as a memory device (e.g., a 1-transistor (1 T) memory cell). For example, a "1" or "0" may be written to a 1 T memory cell by appropriate control of the gate voltage, and this "1" or "0" may be read back by measuring the source/drain current at a specified gate voltage. A ferroelectric material stack may include a first intermediate material, a ferroelectric material, and a second intermediate material, arranged in the gate 172 so that the first intermediate material is between the channel 136 and the ferroelectric material, the ferroelectric material is between the first intermediate material and the second intermediate material, and the second intermediate material is between the ferroelectric material and the gate electrode 140. In some embodiments, the first intermediate material and/or the second intermediate material may not be included in the ferroelectric material stack. In particular, for each embodiment in which the first intermediate material is part of the ferroelectric material stack, there exists a corresponding embodiment in which the first intermediate material is absent (and the ferroelectric material is in contact with the channel 136). Similarly, for each embodiment in which the second intermediate material is part of the ferroelectric material stack, there exists a corresponding embodiment in which the second intermediate material is absent (and the ferroelectric material is in contact with the gate electrode 140).

The ferroelectric material may be any suitable material that exhibits a spontaneous electric polarization that may be induced and reversed by an applied electric field. This polarization may result in excess charge at the faces of the ferroelectric material, and the materials proximate to these faces may compensate by providing or removing electrons, and the electrical properties of the back-end transistor 132 may change accordingly. For example, in embodiments in which the back-end transistor 132 is an NMOS transistor, when positive charge accumulates at the face of the ferroelectric material closest to the channel 136 (with or without an intervening first intermediate material), the threshold voltage of the back-end transistor 132 will decrease; when negative charge accumulates at the face of the ferroelectric material closest to the channel 136 (with or without an intervening first intermediate material), the threshold voltage of the back-end transistor 132 will increase. Similarly, in embodiments in which the back-end transistor 132 is a PMOS transistor, when negative charge accumulates at the face of the ferroelectric material closest to the channel 136 (with or without an intervening first intermediate material), the threshold voltage of the back-end transistor 132 will decrease; when positive charge accumulates at the face of the ferroelectric material closest to the channel 136 (with or without an intervening first intermediate material), the threshold voltage of the back-end transistor 132 will increase.

In some embodiments, the ferroelectric material may include hafnium zirconium oxide, hafnium silicon oxide, hafnium aluminum oxide, hafnium yttrium oxide, hafnium lanthanum oxide, hafnium nickel oxide, or hafnium cobalt oxide. In some embodiments in which the ferroelectric material includes hafnium zirconium oxide ($Hf_xZr_{1-x}O_2$), the hafnium content x may range from 0 to 1. In some embodiments, the ferroelectric material may be hafnium. In some embodiments, the ferroelectric material may include hafnium nitride, hafnium zirconium nitride, hafnium silicon nitride, hafnium aluminum nitride, hafnium yttrium nitride, hafnium lanthanum nitride, hafnium nickel nitride, or hafnium cobalt nitride. In some embodiments, the ferroelectric material may include hafnium oxide nitride, hafnium zirconium oxide nitride, hafnium silicon oxide nitride, hafnium aluminum oxide nitride, hafnium yttrium oxide nitride, hafnium lanthanum oxide nitride, hafnium nickel oxide nitride, or hafnium cobalt oxide nitride.

In some embodiments, the ferroelectric material may be a perovskite material. For example, the ferroelectric material may include lead zirconium titanate, bismuth ferrite, lanthanum strontium manganate, or other complex oxides. The ferroelectric material may also include any combination of the ferroelectric materials disclosed herein. In some embodiments, the ferroelectric material may have a thickness between 2 nanometers and 20 nanometers.

The ferroelectric material may have an orthorhombic crystal lattice (one in which all three mutually perpendicular axes of the unit cell are different in length) in at least some of its volume. In some embodiments, at least 20% of crystals of the ferroelectric material are arranged in an orthorhombic crystal lattice; such embodiments may exhibit adequate ferroelectricity during operation.

In some embodiments in which the first intermediate material is absent from the material 138, at least some of the grains of the ferroelectric material (e.g., the crystals of the ferroelectric material at the face of the ferroelectric material that is in contact with the channel 136) may be aligned with the grains of the channel 136. For example, in some embodiments in which the ferroelectric material is in contact with the channel 136, at least 5% of crystals of the ferroelectric material may have a grain orientation that is aligned with a grain orientation of the channel 136. This matched orientation may extend partially into the thickness of the ferroelectric material from the interface between the ferroelectric material and the channel 136, or through the full thickness of the ferroelectric material. In some embodiments in which the second intermediate material is absent from the material 138, at least some of the grains of the ferroelectric material (e.g., the crystals of the ferroelectric material at the face of the ferroelectric material that is in contact with the gate electrode 140) may be aligned with the grains of the gate electrode 140. For example, in some embodiments in which the ferroelectric material is in contact with the gate electrode 140, at least 5% of crystals of the ferroelectric material may have a grain orientation that is aligned with a grain orientation of the gate electrode 140. This matched orientation may extend partially into the thickness of the ferroelectric material from the interface between the ferroelectric material and the gate electrode 140, or through the full thickness of the ferroelectric material. These properties may differentiate some embodiments of the ferroelectric material from some other gate dielectric materials in which there is no correspondence between the grain orientation of the gate dielectric materials and the adjacent channel and gate electrode materials.

In some embodiments, the first intermediate material, when present, may be a high-k dielectric. For example, the first intermediate material may include elements such as hafnium, silicon, oxygen, titanium, tantalum, lanthanum, aluminum, zirconium, barium, strontium, yttrium, lead, scandium, niobium, and zinc. Examples of high-k materials that may be used in the first intermediate material may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, the first intermediate material may be a metal, such as titanium. In some embodiments, the first intermediate material may have a thickness between 1 nanometer and 3 nanometers (e.g., between 1 nanometer and 2 nanometers). In some embodiments, the first intermediate material, when present, may act as a depolarization layer to mitigate the effects of the electric field in the ferroelectric material on the channel 136.

The second intermediate material, when present, may act as an adhesion layer to improve mechanical coupling between the ferroelectric material and the gate electrode 140. For example, if the gate electrode 140 includes platinum, and the ferroelectric material includes hafnium oxide, it may be difficult to grow the ferroelectric material directly on the gate electrode 140; in such embodiments, the use of a second intermediate material like aluminum oxide (which will grow on platinum, and on which hafnium oxide will grow) may aid in fabrication. In some embodiments, the second intermediate material may have at thickness between one monolayer of the second intermediate material and 5 nanometers.

A material 138 including a ferroelectric material stack may be formed using a low-temperature deposition process, such as physical vapor deposition (PVD) (e.g., sputtering), atomic layer deposition (ALD), or chemical vapor deposition (CVD). The ability to deposit the ferroelectric material stack at temperatures low enough to be compatible with back-end manufacturing processes represents a particular advantage. The ferroelectric material stack may be deposited on sidewalls or conformably on any desired structure to a precise thickness, allowing the manufacture of back-end transistors 132 having any desired geometry.

The back-end transistor 132 may include source/drain (S/D) regions 134 disposed on the channel 136 such that the S/D regions 134 are not coplanar with the channel 136, but this is simply illustrative and any suitable arrangement of S/D regions 134, channels 136, and gates 172 may be used. The S/D regions 134 may include one or more layers of metal and/or metal alloys, as known for thin film transistors based on semiconductor oxide systems.

In some embodiments, the material 138 may not include a ferroelectric material stack, but may instead be provided by any of the embodiments of the gate dielectric discussed below with reference to the gate dielectric of the transistor 142 of FIG. 6.

FIG. 6 is a side, cross-sectional view of an example front-end layer 124 that may be included in a neural core region 106 of a neural computing die 100. The front-end layer 124 may be formed on a substrate 146 (e.g., the wafer 1500 of FIG. 7). The substrate 146 may be a semiconductor substrate composed of semiconductor material systems including, for example, n-type or p-type material systems. The substrate 146 may include, for example, a crystalline substrate formed using a bulk silicon or a silicon-on-insulator substructure. In some embodiments, the substrate 146 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 146. Although a few examples of materials from which the substrate 146 may be formed are described here, any material that may serve as a foundation for a front-end layer 124 may be used. The substrate 146 may be part of a singulated die (e.g., the dies 1502 of FIG. 7) or a wafer (e.g., the wafer 1500 of FIG. 7).

A front-end region 102 of a neural computing die may include one or more front-end layers 124 disposed on substrates 146. A front-end layer 124 may include features of one or more transistors 142 (e.g., metal oxide semiconductor field-effect transistors (MOSFETs)) formed on the substrate 146. The front-end layer 124 may include, for example, one or more S/D regions 152, a gate 154 to control current flow in the channel 148 of the transistors 142 between the S/D regions 152, one or more S/D contacts 158 (which may take the form of conductive vias) to route electrical signals to/from the S/D regions 152, and gate contacts 160 (which may take the form of conductive vias) to route electrical signals to/from the gate 154. Adjacent transistors 142 may be isolated from each other by a shallow trench isolation (STI) insulating material 144, in some embodiments. The transistors 142 may include additional features not depicted for the sake of clarity, such as device isolation regions and the like. The transistors 142 are not limited to the type and configuration depicted in FIG. 6 and may include a wide variety of other types and configurations such as, for example, planar transistors, nonplanar transistors, or a combination of both. Nonplanar transistors may include FinFET transistors, such as double-gate transistors or tri-gate transistors, and wire-based transistors such as wrap-around or all-around gate transistors (e.g., nanoribbon or nanowire transistors).

Each transistor 142 may include a gate 154 including a gate dielectric and a gate electrode. The gate electrode of the transistor 142 may include at least one p-type work function metal or n-type work function metal, depending on whether the transistor 142 is to be a PMOS transistor or an NMOS transistor. For a PMOS transistor, metals that may be used for the gate electrode of the transistor 142 may include, but are not limited to, ruthenium, palladium, platinum, cobalt, nickel, and conductive metal oxides (e.g., ruthenium oxide). For an NMOS transistor, metals that may be used for the gate electrode of the transistor 142 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode of the transistor 142 may consist of a stack of two or more metal layers, where one or more metal layers are work function metal layers and at least one metal layer is a fill metal layer. Further metal layers may be included for other purposes, such as to act as a barrier layer.

The gate dielectric of the transistor 142 may be, for example, silicon oxide, aluminum oxide, or a high-k dielectric, such as hafnium oxide. More generally, the gate dielectric of the transistor 142 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric of the transistor 142 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric of the transistor 142 to improve the quality of the gate dielectric of the transistor 142.

In some embodiments, when viewed as a cross section of the transistor 142 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode of the transistor 142 may simply be a planar layer that is substantially parallel to the top surface of the substrate and does not include sidewall portions substantially perpendicular to the top surface of the substrate. In other embodiments, the gate electrode of the transistor 142 may consist of a combination of U-shaped structures and planar non-U-shaped structures. For example, the gate electrode of the transistor 142 may consist of one or more U-shaped metal layers formed atop one or more planar non-U-shaped layers. In some embodiments, the gate electrode may consist of a V-shaped structure.

In some embodiments, a pair of sidewall spacers 156 may be formed on opposing sides of the gate 154 to bracket the gate 154. The sidewall spacers 156 may be formed from a material such as silicon nitride, silicon oxide, silicon carbide, silicon nitride doped with carbon, and silicon oxynitride. Processes for forming sidewall spacers 156 are well known in the art and generally include deposition and etching process steps. In some embodiments, multiple pairs of sidewall spacers 156 may be used; for instance, two pairs, three pairs, or four pairs of sidewall spacers 156 may be formed on opposing sides of the gate stack.

The S/D regions 152 may be formed within the substrate 146 adjacent to the gate 154 of each transistor 142. For example, the S/D regions 152 may be formed using either an implantation/diffusion process or a deposition process. In the former process, dopants such as boron, aluminum, antimony, phosphorous, or arsenic may be ion-implanted into the substrate 146 to form the S/D regions 152. An annealing process that activates the dopants and causes them to diffuse farther into the substrate 146 may follow the ion-implantation process. In the latter process, an epitaxial deposition process may provide material that is used to fabricate the S/D regions 152. In some implementations, the S/D regions 152 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 152 may be formed using one or more alternate semiconductor materials such as germanium or a group III-V material or alloy. In further embodiments, one or more layers of metal and/or metal alloys may be used to form the S/D regions 152. In some embodiments, an etch process may be performed before the epitaxial deposition to create recesses in the substrate 146 in which the material for the S/D regions 152 is deposited.

Electrical signals, such as power and/or input/output (I/O) signals, may be routed to/from the transistors 142 of the front-end layer 124 (and/or to/from transistors 132 of the back-end layer 122) through one or more interconnect layers (like the interconnect layer 168 discussed above with reference to FIG. 4) disposed on the front-end layer 124. Interconnects, such as the S/D contacts 158 and gate contacts 160 may be referred to as Metal 0 (M0). In some embodiments, a front-end layer 124 may include one or more interconnects that extend through the front-end layer 124; in FIG. 6, this is illustrated as a conductive via 162 in contact with a through-substrate via (TSV) 164. When the substrate 146 includes silicon, the TSV 164 may be referred to as a "through-silicon via"). The use of TSVs 164 may allow interconnects to be made to the neural computing die 100 on at opposite faces of the front-end layer 124, which may be particularly valuable in certain settings (e.g., wafer-to-wafer bonding settings).

A neural computing die 100 may include a solder resist material (e.g., polyimide or similar material) and one or more bond pads formed on the interconnect layers (e.g., formed on an input region 110). The bond pads may be electrically coupled with the interconnect structures and may route the electrical signals of the neural computing die 100 to other external devices. For example, solder bonds may be formed on the one or more bond pads=to mechanically and/or electrically couple a chip including the neural computing die 100 with another component (e.g., a circuit board). The neural computing die 100 may include other structures to route the electrical signals from the interconnect layers than depicted in other embodiments. For example, the bond pads may be replaced by or may further include other analogous features (e.g., posts) that route electrical signals to external components.

The neural computing dies 100 disclosed herein may be included in any suitable electronic component. FIGS. 7-10 illustrate various examples of apparatuses that may include any of the neural computing dies 100 disclosed herein.

Figure 7:
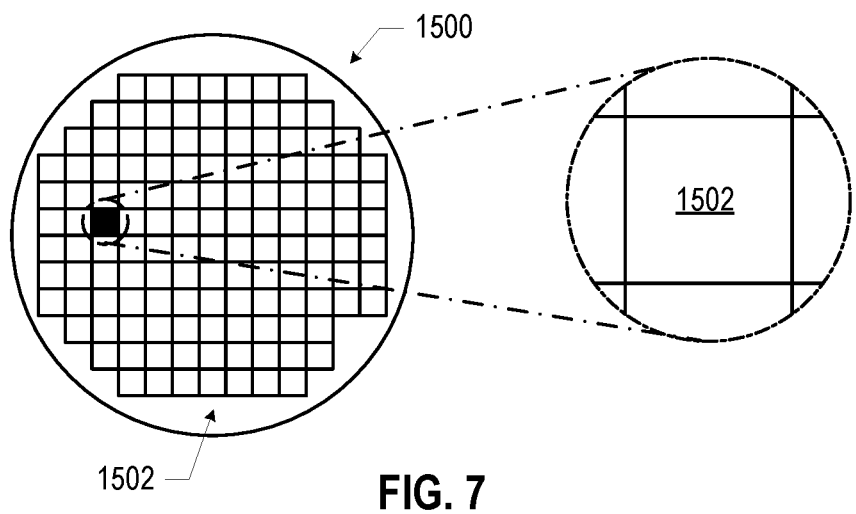
FIG. 7 is a top view of a wafer and dies that may include a neural computing die, in accordance with any of the embodiments disclosed herein.

FIG. 7 is a top view of a wafer 1500 and dies 1502 that may include one or more neural computing dies 100 in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be a neural computing die 100, in accordance with any of the embodiments disclosed herein (e.g., may include one or more transistors 142, transistors 132, neural core regions 106, inter-core interconnect regions 108, etc.). In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 10) or other logic that is configured to store information in the memory devices or execute instructions stored in the memory array.

Figure 8:
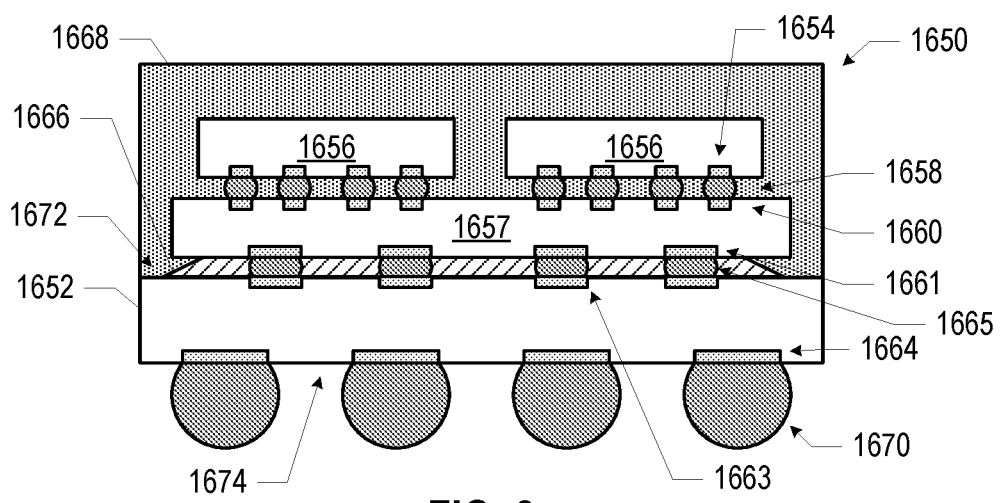
FIG. 8 is a side, cross-sectional view of an integrated circuit (IC) package that may include a neural computing die, in accordance with various embodiments.

FIG. 8 is a side, cross-sectional view of an example IC package 1650 that may include one or more neural computing dies 100. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may include conductive lines and/or conductive vias, arranged as desired.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 8 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 8 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 8 are solder balls (e.g., for a ball grid array arrangement), but any suitable second-level interconnects 1670 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 9.

The dies 1656 may take the form of any of the embodiments of the die 1502 discussed herein (e.g., may include any of the embodiments of the neural computing die 100). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory). In some embodiments, a die 1656 may be a neural computing die 100, in accordance with any of the embodiments disclosed herein Although the IC package 1650 illustrated in FIG. 8 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 8, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 9:
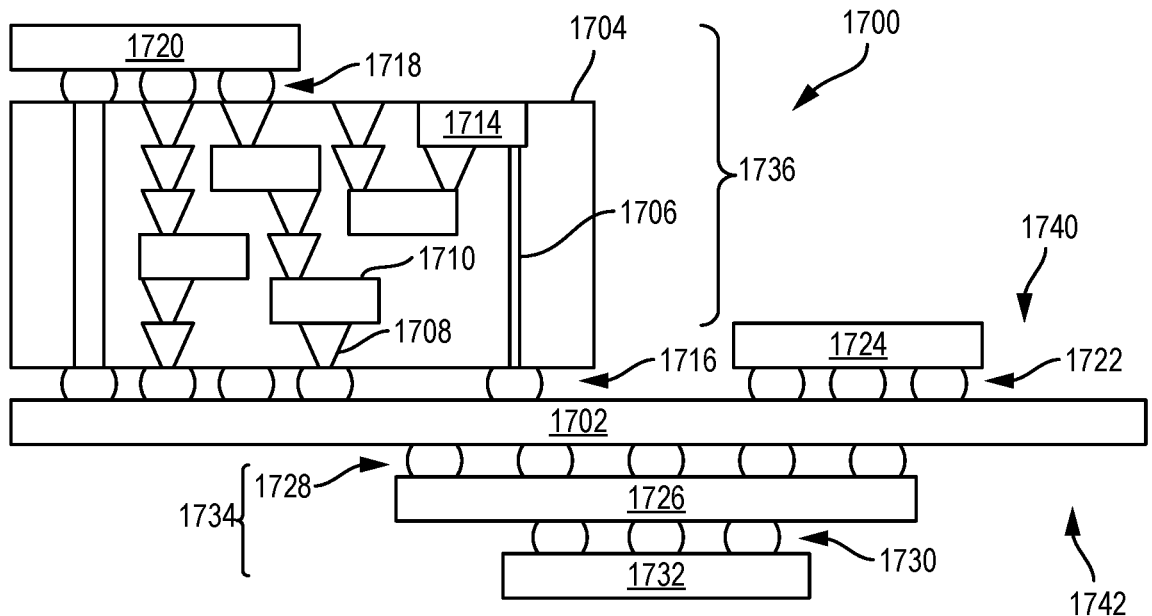
FIG. 9 is a side, cross-sectional view of an IC device assembly that may include a neural computing die, in accordance with any of the embodiments disclosed herein.

FIG. 9 is a side, cross-sectional view of an IC device assembly 1700 that may include one or more IC packages or other electronic components (e.g., a die) including one or more neural computing dies 100, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 8 (e.g., may include one or more neural computing dies 100).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 9 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 9), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 9, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 7, such as a neural computing die 100) or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 9, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 9 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 10:
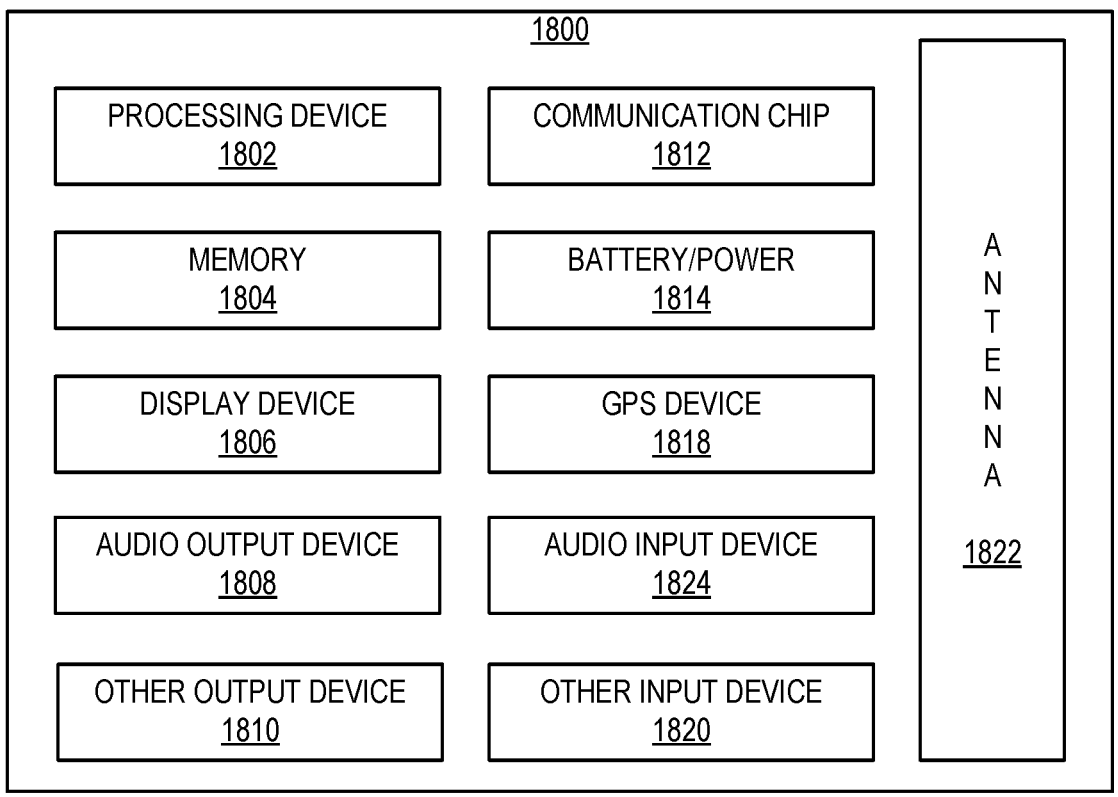
FIG. 10 is a block diagram of an example electrical device that may include a neural computing die, in accordance with any of the embodiments disclosed herein.

FIG. 10 is a block diagram of an example electrical device 1800 that may include one or more neural computing dies 100, in accordance with any of the embodiments disclosed herein. For example, any suitable ones of the components of the electrical device 1800 may include one or more of the IC device assemblies 1700, IC packages 1650, or dies 1502 disclosed herein. A number of components are illustrated in FIG. 10 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 10, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some particular embodiments, the processing device 1802 may include one or more vision processing units (VPUs) or other artificial intelligence (AI)- or neural network (NN)-specific processing devices; any of these processing devices 1802 may include any of the neural computing dies 100 disclosed herein. In some embodiments, the neural computing dies 100 disclosed herein may be included in a single system-on-chip (SoC), which may include one or more CPUs, GPUs, VPUs, other AI/NN-specific processing units; such embodiments may be particularly useful in a mobile or handheld computing device. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a neural computing die, including: a first neural core region; a second neural core region; and an inter-core interconnect region in a volume between the first neural core region and the second neural core region, wherein the inter-core interconnect region includes a conductive pathway between the first neural core region and the second neural core region, and the conductive pathway includes a conductive via.

Example 2 includes the subject matter of Example 1, and further specifies that the first neural core region is in a back-end region of the neural computing die.

Example 3 includes the subject matter of Example 2, and further specifies that the first neural core region includes a transistor.

Example 4 includes the subject matter of Example 3, and further specifies that the transistor includes a ferroelectric material.

Example 5 includes the subject matter of Example 2, and further specifies that the first neural core region does not include a transistor.

Example 6 includes the subject matter of any of Examples 2-5, and further specifies that the neural computing die includes a conductive pathway between the first neural core region and a transistor in a front-end region of the neural computing die.

Example 7 includes the subject matter of Example 6, and further specifies that the transistor is a fin-based transistor or a wire-based transistor.

Example 8 includes the subject matter of any of Examples 2-7, and further specifies that the second neural core region is in the back-end region of the neural computing die.

Example 9 includes the subject matter of Example 8, and further specifies that the second neural core region includes a transistor.

Example 10 includes the subject matter of Example 9, and further specifies that the transistor is a thin film transistor.

Example 11 includes the subject matter of Example 8, and further specifies that the second neural core region does not include a transistor.

Example 12 includes the subject matter of any of Examples 8-11, and further specifies that the neural computing die includes a conductive pathway between the second neural core region and a transistor in a front-end region of the neural computing die.

Example 13 includes the subject matter of Example 12, and further specifies that the transistor is a fin-based transistor or a wire-based transistor.

Example 14 includes the subject matter of any of Examples 2-6, and further specifies that the second neural core region is in a front-end region of the neural computing die.

Example 15 includes the subject matter of Example 1, and further specifies that the first neural core region and the second neural core region are in front-end regions of the neural computing die.

Example 16 includes the subject matter of any of Examples 1-15, and further specifies that a front-end region of the neural computing die includes a through-substrate via.

Example 17 includes the subject matter of any of Examples 1-16, and further specifies that the second neural core region includes a neural core, the inter-core interconnect region includes conductive pathways between outputs of the first neural core region and inputs of the neural core, the outputs of the first neural core region correspond to pixels, the inputs of the neural core correspond to pixels, and the pixels corresponding to the outputs of the first neural core region includes the pixels corresponding to the inputs of the neural core and pixels that are neighbors to the pixels corresponding to the inputs of the neural core.

Example 18 includes the subject matter of any of Examples 1-17, and further specifies that the conductive via narrows towards the second neural core region.

Example 19 includes the subject matter of any of Examples 1-18, and further includes: a charge-coupled device array, wherein the first neural core region is between the charge-coupled device array and the second neural core region.

Example 20 includes the subject matter of any of Examples 1-19, and further includes: logic circuitry, wherein the second neural core region is between the logic circuitry and the first neural core region.

Example 21 is a neural computing die, including: a first neural core region, wherein the first neural core region includes a first transistor; a second neural core region, wherein the second neural core region includes a second transistor; and an inter-core interconnect region in a volume between the first neural core region and the second neural core region, wherein the inter-core interconnect region includes a conductive pathway between the first neural core region and the second neural core region, and the conductive pathway includes a conductive via.

Example 22 includes the subject matter of Example 21, and further specifies that the first neural core region is in a back-end region of the neural computing die.

Example 23 includes the subject matter of any of Examples 21-22, and further specifies that the first transistor includes a ferroelectric material.

Example 24 includes the subject matter of any of Examples 21-23, and further specifies that the second neural core region is in the back-end region of the neural computing die.

Example 25 includes the subject matter of any of Examples 21-24, and further specifies that the second transistor is a thin film transistor.

Example 26 includes the subject matter of any of Examples 21-23, and further specifies that the second neural core region is in a front-end region of the neural computing die.

Example 27 includes the subject matter of Example 26, and further specifies that the second transistor is a fin-based transistor or a wire-based transistor.

Example 28 includes the subject matter of Example 21, and further specifies that the first neural core region is in a front-end region of the neural computing die.

Example 29 includes the subject matter of Example 28, and further specifies that the first transistor is a fin-based transistor or a wire-based transistor.

Example 30 includes the subject matter of any of Examples 21-29, and further specifies that the second neural core region includes a neural core, the inter-core interconnect region includes conductive pathways between outputs of the first neural core region and inputs of the neural core, the outputs of the first neural core region correspond to pixels, the inputs of the neural core correspond to pixels, and the pixels corresponding to the outputs of the first neural core region includes the pixels corresponding to the inputs of the neural core and pixels that are neighbors to the pixels corresponding to the inputs of the neural core.

Example 31 includes the subject matter of any of Examples 21-30, and further specifies that the conductive via narrows towards the second neural core region.

Example 32 includes the subject matter of any of Examples 21-31, and further includes: a charge-coupled device array, wherein the first neural core region is between the charge-coupled device array and the second neural core region.

Example 33 includes the subject matter of any of Examples 21-32, and further includes: logic circuitry, wherein the second neural core region is between the logic circuitry and the first neural core region.

Example 34 is a neural computing assembly, including: a support component; and a neural computing die coupled to the support component, wherein the neural computing die includes: a first neural core region, a second neural core region, and an inter-core interconnect region in a volume between the first neural core region and the second neural core region, wherein the inter-core interconnect region includes a conductive pathway between the first neural core region and the second neural core region, and the conductive pathway includes a conductive via.

Example 35 includes the subject matter of Example 34, and further specifies that the support component includes a package substrate.

Example 36 includes the subject matter of any of Examples 34-35, and further specifies that the support component includes an interposer.

Example 37 includes the subject matter of any of Examples 34-36, and further specifies that the support component includes a circuit board.

Example 38 includes the subject matter of Example 37, and further specifies that the circuit board is a motherboard.

Example 39 includes the subject matter of any of Examples 34-38, and further specifies that the neural computing die is one of a plurality of neural computing dies coupled to the support component.

Example 40 includes the subject matter of any of Examples 34-39, and further includes: an image capture device communicatively coupled to the neural computing die.

Example 41 includes the subject matter of any of Examples 34-40, and further specifies that the neural computing die is coupled to the support component by solder.

Example 42 is a method of manufacturing a neural computing assembly, including forming a neural computing die by: providing a first neural core region; providing an inter-core interconnect region; and providing a second neural core region, wherein the inter-core interconnect region is in a volume between the first neural core region and the second neural core region, the inter-core interconnect region includes a conductive pathway between the first neural core region and the second neural core region, and the conductive pathway includes a conductive via.

Example 43 includes the subject matter of Example 42, and further includes coupling an image capture device to the neural computing die.

The invention claimed is:

1. A neural computing die, comprising:
   a first neural core region;
   a second neural core region;
   an inter-core interconnect region in a volume between the first neural core region and the second neural core region, wherein the inter-core interconnect region includes a conductive pathway between the first neural core region and the second neural core region, and the conductive pathway includes a conductive via; and
   a charge-coupled device array,
   wherein the first neural core region is between the charge-coupled device array and the second neural core region.

2. The neural computing die of claim 1, wherein the first neural core region is in a back-end region of the neural computing die.

3. The neural computing die of claim 2, wherein the first neural core region includes a transistor.

4. The neural computing die of claim 3, wherein the transistor includes a ferroelectric material.

5. The neural computing die of claim 2, wherein the first neural core region does not include a transistor.

6. The neural computing die of claim 2, wherein the neural computing die includes a conductive pathway between the first neural core region and a transistor in a front-end region of the neural computing die.

7. The neural computing die of claim 6, wherein the transistor is a fin-based transistor or a wire-based transistor.

8. A neural computing die, comprising:
   a first neural core region, wherein the first neural core region includes a first transistor;
   a second neural core region, wherein the second neural core region includes a second transistor; and
   an inter-core interconnect region in a volume between the first neural core region and the second neural core region, wherein the inter-core interconnect region includes a conductive pathway between the first neural core region and the second neural core region, and the conductive pathway includes a conductive via,
   wherein outputs of the first neural core region correspond to pixels, inputs of the second neural core region correspond to pixels, and the pixels corresponding to the outputs of the first neural core region includes the pixels corresponding to the inputs of the second neural core region and pixels that are neighbors to the pixels corresponding to the inputs of the second neural core region.

9. The neural computing die of claim 8, wherein the second neural core region is in a front-end region of the neural computing die.

10. The neural computing die of claim 8, wherein the first neural core region is in a front-end region of the neural computing die.

11. The neural computing die of claim 8, wherein the second neural core region includes a neural core, the inputs of the second neural core region are inputs of the neural core, and the inter-core interconnect region includes conductive pathways between the outputs of the first neural core region and the inputs of the neural core.

12. The neural computing die of claim 8, wherein the conductive via narrows towards the second neural core region.

13. The neural computing die of claim 8, further comprising:
    a charge-coupled device array, wherein the first neural core region is between the charge-coupled device array and the second neural core region.

14. The neural computing die of claim 8, further comprising:
    logic circuitry, wherein the second neural core region is between the logic circuitry and the first neural core region.

15. A neural computing assembly, comprising:
    a support component; and
    a neural computing die coupled to the support component, wherein the neural computing die includes:
      a first neural core region,
      a second neural core region,
      an inter-core interconnect region in a volume between the first neural core region and the second neural core region, wherein the inter-core interconnect region includes a conductive pathway between the first neural core region and the second neural core region, and the conductive pathway includes a conductive via, and
      a charge-coupled device array,
      wherein the first neural core region is between the charge-coupled device array and the second neural core region.

16. The neural computing assembly of claim 15, wherein the support component includes a package substrate.

17. The neural computing assembly of claim 15, wherein the support component includes an interposer.

18. The neural computing assembly of claim 15, wherein the support component includes a circuit board.

19. The neural computing assembly of claim 15, wherein the neural computing die is one of a plurality of neural computing dies coupled to the support component.

20. The neural computing assembly of claim 15, further comprising:
    an image capture device communicatively coupled to the neural computing die.

* * * * *